United States Patent [19]

Jamieson

[11] Patent Number: 4,988,577

[45] Date of Patent: Jan. 29, 1991

[54] PRINTED CIRCUIT BOARD STIFFENER

[75] Inventor: John A. Jamieson, Downey, Calif.

[73] Assignee: Bussco Engineering, Inc., El Segundo, Calif.

[21] Appl. No.: 363,278

[22] Filed: Jun. 8, 1989

[51] Int. Cl.[5] ............................. B32B 3/02; B32B 3/06
[52] U.S. Cl. .................................... 428/573; 428/596; 428/131; 428/134; 428/901; 428/192; 174/135; 174/255; 361/397
[58] Field of Search ............... 428/596, 583, 131, 134, 428/901, 43, 573, 192; 174/68.5, 135; 361/397

[56] References Cited

U.S. PATENT DOCUMENTS 3,469,018  9/1969  Arny .................................. 174/68.5
3,558,289  1/1971  Cervenka et al. .................. 428/596
4,109,298  8/1978  Hanni et al. ....................... 174/68.5

Primary Examiner—Alexander S. Thomas
Attorney, Agent, or Firm—Jack C. Munro

[57] ABSTRACT

A stiffener for a printed circuit board which comprises an elongated metallic electrically conductive bar. Extending from the bar are a plurality of spaced apart pins with these pins being in longitudinal alignment. Each pin is constructed to facilitate physical deformation such as by including a through opening within the body of the pin or with the pin including notched-out areas in the side walls of the pin. Upon the pin incurring a sufficiently powerful striking force, the pin will deform and expand laterally.

4 Claims, 2 Drawing Sheets

PRINTED CIRCUIT BOARD STIFFENER

BACKGROUND OF THE INVENTION

The field of this invention relates to electronics and more particularly to a mechanical device to rigidize a printed circuit board and to eliminate and/or minimize the bow and twist introduced to the board during various board manufacturing processes.

Boards upon which are mounted specific electronic circuits and components are used extensively within electronic equipment. As circuits increase in complexity, printed circuit boards have been developed into multi-layered boards wherein each layer, with its associated electrical circuits, are a plane within the board envelope. Insulating layers are interleaved with different interconnected printed conductor patterns.

At the present time, boards are manufactured from a variety of board materials. The most common board material is a composition of glass fabrics or fibers bonded with epoxy resins. Other compositions used are made up by various other material like aramid fibers and polymide or polytetrafluoroethylene resins. It is well-known that all boards tend to warp when subjected to heat, wave soldering for example.

Typical manufacturing procedure requires that the board be impregnated with resin and then cured within an over. Curing temperatures of one hundred seventy degrees centigrade are quite common along with a curing pressure of one thousand five hundred pounds per square inch.

Common usage for printed circuit boards is for the board to be "plugged in" to a particular piece of electronic hardware such as a computer. A particular piece of electronic hardware may have literally hundreds of such boards. Each board has its own "slot" in which the board is to be installed. The space allotted to the particular board conforms closely to the board itself. At times, during the manufacture of the board, the board may assume a warped or slightly non-planar configuration which is the result of the various manufacturing processes. This warping of the board may make it impossible to install such in its particular slot.

In the past, it has been known to install a circuit board stiffener on the board to prevent the board from assuming warped configuration. These stiffeners are installed at selected locations, generally both longitudinal and transversely, to insure that the board will be maintained planar. A typical stiffener comprises an elongated metallic bar which is to be mounted in a fixed relationship onto the upper or bottom surface of the board. Typical installation will sue a conventional fastener such as rivet or soldering to securely fixed in position the stiffener to the board. Generally, the stiffener will be constructed of an electrically conductive material and the stiffener may also function as power distributor or as a common electrical ground for a portion of the circuitry embodied within the board.

The mounting of the stiffener on the board by either installing of fasteners or by soldering is a time consuming and expensive procedure. Previous to the present invention, there has not been known an easy quick way to install a stiffener in conjunction with a printed circuit board.

SUMMARY OF THE INVENTION

The structure of the present invention constitutes an elongated narrow metallic bar from which extends in a spaced row a plurality of pins. Within each pin is incorporated an opening and/or notches. Each pin is to be located within and protrude exteriorly from a respective hole formed within a printed circuit board so that all the pins protrude slightly from the undersurface of the board. Each of the pins are then to be struck with a force applying tool which causes the pin to partially collapse and expand laterally. This expansion laterally is sufficient to form a secure connection with the hole wall surface, circuitry or both. As a result, the elongated bar is fixed in position on the printed circuit board.

The primary objective of the present invention is to construct a stiffener for a printed circuit board which can be installed quickly and easily eliminating expensive and time consuming installation procedures.

DETAILED DESCRIPTION OF THE SHOWN EMBODIMENT

Figure 1:
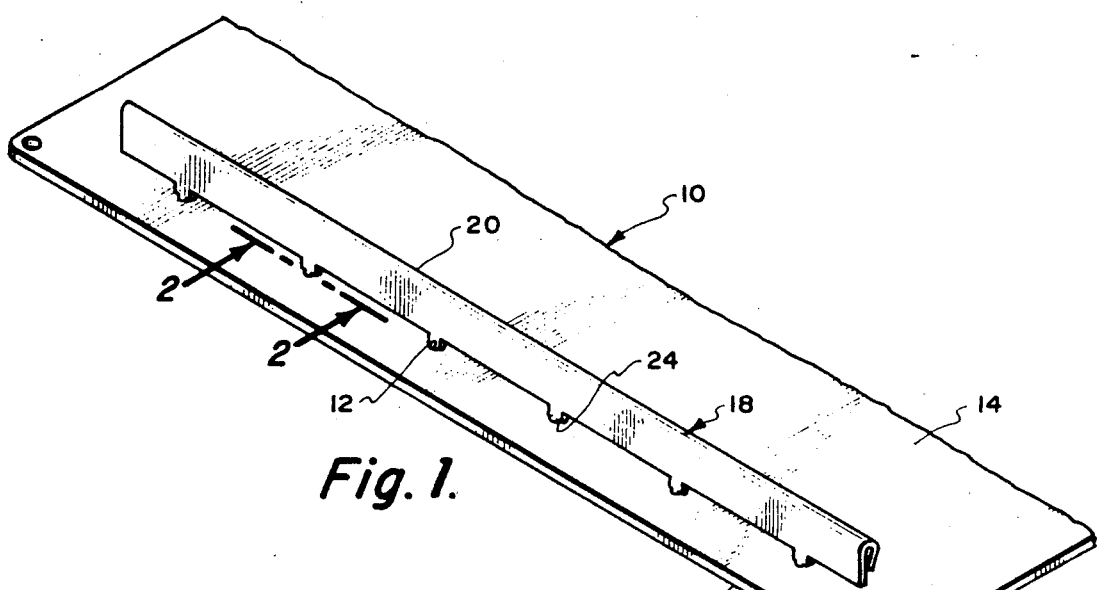
FIG. 1 is an isometric view of that portion of a printed circuit board upon which has been installed the printed circuit board stiffener of the present invention.
Figure 2:
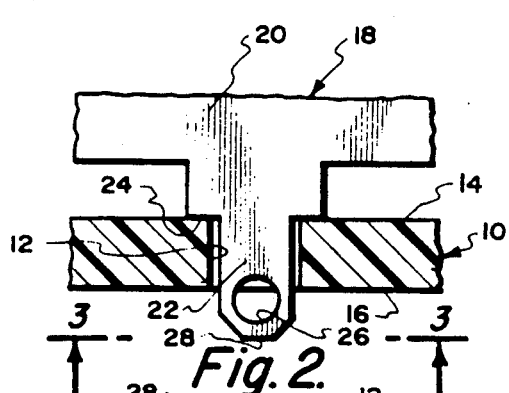
FIG. 2 is a cross sectional view taken through the board along line 2—2 of FIG. 1 showing more clearly a pin mounted within a hole in the printed circuit board with the pin not being fixed to the board.
Figure 4:
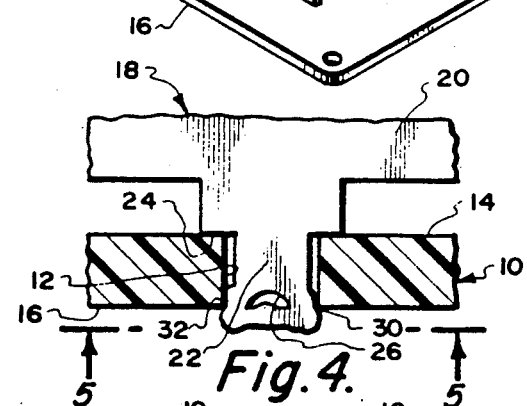
FIG. 4 is a view similar to FIG. 2 but showing the pin in its installed position.
Figure 3:
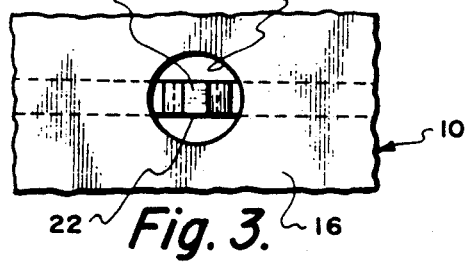
FIG. 3 is a bottom plain view taken along 3—3 of FIG. 2.
Figure 5:
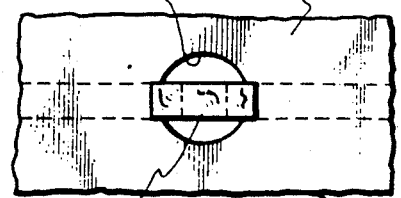
FIG. 5 is a view taken along line 5—5 of FIG. 4.

Referring specifically to the drawings, there is shown a printed circuit board 10 which is to include an appropriate electrical circuit pattern (not shown). The circuit board 10 will normally include a plurality of spaced apart holes 12. The printed circuit board 10 has an upper surface 14 and a lower surface 16.

In order to insure that the printed circuit board 10 is to remain planar, that is not to warp during heat treating of the board 10, there is to be mounted on the board 10 the stiffener 18 of this invention. The stiffener 18 is shown in FIGS. 1 through 5 of the drawings. Stiffener 18 is composed of an elongated bar 20 which is composed of an electrically conductive metallic material with that sheet metal being preferred. The bar 20 is shown to be of low height and narrow in width. The bar 20 is actually constructed in a hairpin configuration when taken in cross section. Because of this hairpin configuration, bending of the bar 20 in a direction toward and away from the upper surface 14 is prevented with the bar 20 being maintained in a straight configuration.

It is to be understood that the actual shape in cross section of the bar 20 could be altered. For example, the bar 20 could assume an L-shape configuration in cross section. It is also to be understood that the thickness of the sheet material employed within the bar 20 could vary as well as the type of material within bar 20. Typical material would be a tin plated brass.

Integrally connected to the bar 20 and extending therefrom are a plurality of pins 22. These pins 22 are identical and are normally evenly spaced apart. The exact spacing can vary for the particular installation. Also a particular installation may dictate that the pins 22 not be evenly spaced apart. The pins 22 are in longitudinal alignment.

Associated with each pin 22 is a shoulder 24. The shoulder 24 is to abut against the upper surface 14 of the printed circuit board 10. A pin 22 is to extend through a hole 12.

Each pin 22 is to include some type of structural change to make the pin 22 frangible. In referring particularly to FIGs. 1 through 5, this type of structural change has to do with incorporating of a through opening 26 within the body of the pin 22. The outer end of the pin 22 is beveled forming a somewhat sharpened point 28.

When the stiffener 18 is installed in position as shown in FIG. 1 in conjunction with the printed circuit board 10, the bar 20 is solidly supported along its longitudinal length usually within some type of fixture (not shown). A striking tool, such as a hammer (not shown), is to apply an impact force to the somewhat pointed end 28 which causes the outer end of the pin 22 to deform and collapse about the through opening 26. This collapsing is clearly shown in FIG. 4. As a result, the lateral dimensions of each pin 22 is increased resulting in the lateral edges 30 and 32 being expanded into the engagement with the side walls of the hole 12. It is to be understood that this type of deforming procedure is to be completed for each and every pin 22 which will then result in the stiffener 18 being securely fastened on the printed circuit board 10.

Figure 6:
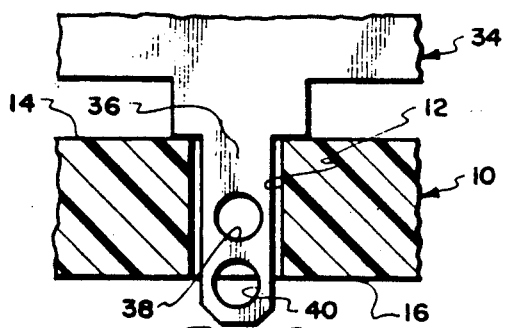
FIG. 6 is a view similar to FIg. 2 but of a modified form of a pin.
Figure 7:
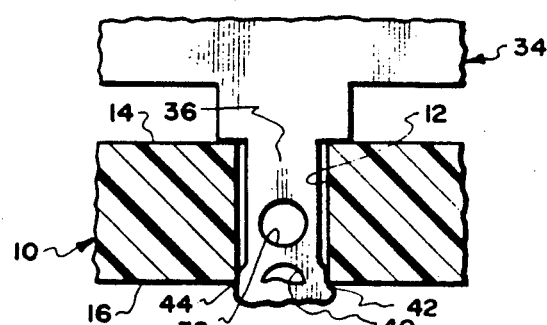
FIG. 7 is a view of the modified form of a pin of FIG. 6 but showing the pin in its installed position which is similar to the position shown in FIG. 4.

In referring to FIGs. 6 and 7 of the drawings, there is shown a modified form of stiffener 34 in which the pin 36 includes a air of spaced apart holes 38 and 40. The only difference between the stiffeners 18 and 34 is that within the stiffener 34 there is utilized a pair of holes 38 and 40 which is similar to hole 265. The reason for this is that if perchance the stiffener 34 is utilized with a thinner printed circuit board 10 then the hole 38 will still permit the lateral edges 42 and 44 of the pin 36 to spread laterally and bind against the wall surface of hole 12. In other words, this stiffener 34 is capably being used with a variety of thicknesses of printed circuit boards 10 where stiffener 18 is intended to be used with approximately one general thickness of printed circuit board 10./

Figure 8:
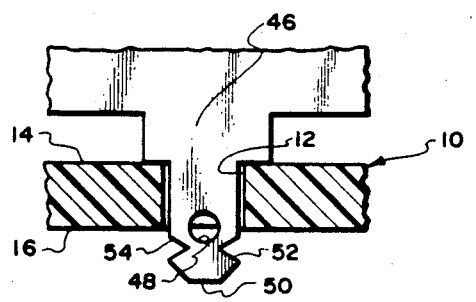
FIG. 8 is a view showing a still further modified form of pin in its non-installed position.

Referring particularly to FIG. 8, there is shown a pin 46 which includes a through opening 48. The outer end of the pin 46 is against beveled to form a somewhat sharpened end 50. Formed within the side walls of the pin 46 are a pair of notches 542 and 54. The combination of the hole 48 and the notches 52 and 54 provide for the frangible nature of the pin 46 and permit such to be readily deformed and spread laterally upon the somewhat sharpened end 50 being impacted.

Figure 9:
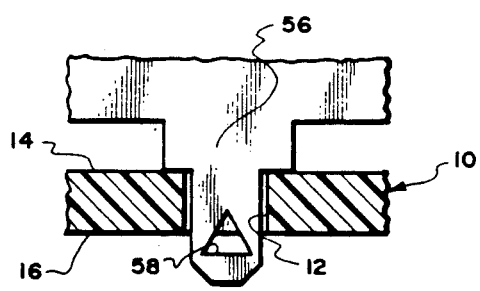
FIG. 9 is a view of a still further modified form of pin which is also shown in its non-installed position.

Referring particularly to FIG. 9, there is shown a pin 56 which instead of including a circular through opening includes a triangular shaped through opening 58. The only difference of the pin in FIG. 9 is that the opening 58 is non-circular and may prove to be more effective for certain types of printed circuit boards.

Figure 10:
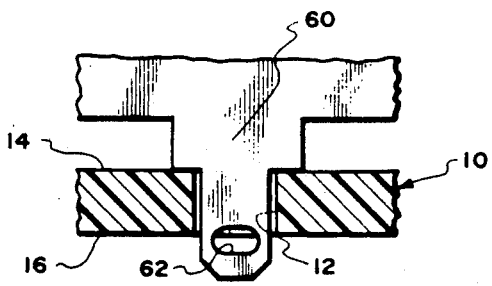
FIG. 10 is a view of a still further modified form of pin which is also shown in its non-installed position.

Referring particularly to FIG. 10, there is again shown a modified form of pin 60 which includes an elliptical shaped through opening 62. Again,. this elliptical shape through impending 62 may prove to be most effective with certain types or certain thicknesses of printed circuit boards.

What is claimed is:

1. A printed circuit board stiffener comprising:
    an elongated bar, said elongated bar being rigid, said elongated bar being narrow;
    a plurality of pins integrally connected to said elongated bar, said pins being spaced apart and extending outwardly from said elongated bar, each said pin adapted to be inserted within a close conforming hole formed within a printed circuit board, each said pin including frangible means, said frangible means permitting the deforming of each said pinion application of a sufficiently powerful striking force causing collapsing and lateral expansion of each said pin; and
    said frangible means including a plurality of notches formed within the side walls of each said pin.

2. The printed circuit boards stiffener as defined in claim 8 wherein:
    said elongated bar being electrically conductive.

3. The printed circuit boards stiffener as defined in claim 2 wherein:
    each said pin being identical.

4. The printed circuit board stiffener as defined in claim 1 wherein:
    each said pin including a shoulder, said shoulder being adapted to abut against the surface of the printed circuit board for correct positioning of the printed circuit board relative to said pins.

* * * * *